(12) United States Patent
Hoffmann et al.

(10) Patent No.: US 10,914,290 B2
(45) Date of Patent: Feb. 9, 2021

(54) SYSTEM AND METHOD FOR TESTING AN ENERGY STORAGE DEVICE OF A WIND TURBINE PITCH SYSTEM

(71) Applicant: General Electric Company, Schenectady, NY (US)

(72) Inventors: Till Hoffmann, Osnabrueck (DE); Jorge Gonzalez Castro, Berlin (DE); Jeffrey Alan Melius, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 221 days.

(21) Appl. No.: 15/924,529

(22) Filed: Mar. 19, 2018

(65) Prior Publication Data
US 2019/0285058 A1 Sep. 19, 2019

(51) Int. Cl.
| F03D 17/00 | (2016.01) |
| F03D 9/25 | (2016.01) |
| G01R 31/387 | (2019.01) |
| G01R 31/36 | (2020.01) |
| F03D 7/02 | (2006.01) |

(52) U.S. Cl.
CPC ........... *F03D 17/00* (2016.05); *F03D 7/0224* (2013.01); *F03D 9/255* (2017.02); *G01R 31/3647* (2019.01); *G01R 31/387* (2019.01); *F05B 2260/42* (2013.01); *F05B 2260/76* (2013.01); *F05B 2260/80* (2013.01); *F05B 2260/83* (2013.01); *F05B 2260/845* (2013.01); *F05B 2270/1074* (2013.01); *F05B 2270/326* (2013.01); *F05B 2270/328* (2013.01)

(58) Field of Classification Search
CPC ......... F03D 17/00; F03D 9/255; F03D 7/0224
See application file for complete search history.

(56) References Cited

U.S. PATENT DOCUMENTS

| 7,988,414 B2 * | 8/2011 | Benito | F03D 7/0224 416/33 |
| 8,070,439 B2 * | 12/2011 | Melius | F03D 7/0224 416/61 |
| 2015/0184634 A1 * | 7/2015 | Shen | F03D 7/0224 416/147 |

FOREIGN PATENT DOCUMENTS

| EP | 2 317 129 A2 | 5/2011 |
| EP | 2 578 876 A1 | 4/2013 |

OTHER PUBLICATIONS

EP Search Report, dated Aug. 16, 2019.

* cited by examiner

*Primary Examiner* — Justin D Seabe
*Assistant Examiner* — Michael L Sehn
(74) *Attorney, Agent, or Firm* — Dority & Manning, P.A.

(57) ABSTRACT

A method for testing capacity of at least one energy storage device of a pitch drive mechanism to drive a first rotor blade of a wind turbine connected to a power grid includes defining a rotor position range for implementing a first test procedure for the energy storage device(s). Further, the method includes monitoring a rotor position of the first rotor blade. When the rotor position of the first rotor blade enters the rotor position range, the method includes initiating the first test procedure. The first test procedure includes pitching the first rotor blade via the energy storage device(s), measuring at least one operating condition of the energy storage device(s) during pitching, and determining a capacity of the energy storage device(s) to drive the first rotor blade based on the operating condition(s) thereof.

17 Claims, 6 Drawing Sheets

SYSTEM AND METHOD FOR TESTING AN ENERGY STORAGE DEVICE OF A WIND TURBINE PITCH SYSTEM

FIELD

The present disclosure relates generally to wind turbines, and more particularly to systems and methods for testing an energy storage device, such as a battery, of a pitch system of a wind turbine.

BACKGROUND

Wind power is considered one of the cleanest, most environmentally friendly energy sources presently available, and wind turbines have gained increased attention in this regard. A modern wind turbine typically includes a tower, a generator, a gearbox, a nacelle, and a rotor including one or more rotor blades. The rotor blades capture kinetic energy from wind using known foil principles and transmit the kinetic energy through rotational energy to turn a shaft coupling the rotor blades to a gearbox, or if a gearbox is not used, directly to the generator. The generator then converts the mechanical energy to electrical energy that may be deployed to a utility grid.

During operation, the direction of the wind which powers the wind turbine may change. The wind turbine may thus adjust the nacelle through, for example, a yaw adjustment about a longitudinal axis of the tower to maintain alignment with the wind direction. In addition, the wind turbine may adjust a pitch angle of one or more of the rotor blades via a pitch drive mechanism that drives a pitch bearing to change the angle of the blades with respect to the wind.

Typical pitch drive mechanisms include pitch drive motor, a pitch drive gearbox, and a pitch drive pinion. In such configurations, the pitch drive motor is coupled to the pitch drive gearbox so that the pitch drive motor imparts mechanical force to the pitch drive gearbox. Similarly, the pitch drive gearbox may be coupled to the pitch drive pinion for rotation therewith. The pitch drive pinion may, in turn, be in rotational engagement with the pitch bearing coupled between the hub and a corresponding rotor blade such that rotation of the pitch drive pinion causes rotation of the pitch bearing. Thus, in such embodiments, rotation of the pitch drive motor drives the pitch drive gearbox and the pitch drive pinion, thereby rotating the pitch bearing and the rotor blade about the pitch axis.

During normal operation, the pitch drive motors are driven by power supplied by the grid. However, in some instances, such as during an adverse grid event, the pitch drive motors may be driven by one or more backup batteries. If pitching of the blades relies on such batteries (i.e. due to a grid loss), it is important to ensure that the batteries are capable of operating when needed. Overtime, however, the motor batteries of the pitch drive mechanisms lose their charge and eventually die. Thus, if such batteries die without notice, the rotor blade associated with the non-operative batteries may become stuck since there is no power available to pitch the blade. In such instances, loads may increase on the stuck rotor blade, thereby causing damage thereto.

As such, the batteries need to be tested on a regular basis to test their capacity and/or ability to drive the rotor blades back to a feathered position in case of a grid loss or other disturbances. A common way to perform such testing is to drive the rotor blades to a blade angle of 0° by grid power and switch the drives to battery power (or capacitors or springs) afterwards. Thus, the rotor blades are pitched back to the feathered position while drawing energy from the batteries. The battery/capacitor voltage as well as the pitch speed are measured during this battery-driven movement and used as a measure of the condition of the batteries.

However, for modern rotor blades having a large pre-bend or curve, the center of gravity of the blade is not in the center of rotation of the blade. Therefore, curved rotor blades may be purely driven by gravity in certain rotor positions with no energy being required from the batteries to reach the feathered position. In such instances, testing may be deemed successful even if the battery is completely non-operative.

As such, a system and method that addresses the aforementioned issues would be desired. More specifically, with the shift in the center of gravity, a strong dependency between actual blade position and motor torque needed to drive the blades back to feathered position is introduced. Accordingly, the present disclosure is directed to systems and methods for testing pitch system batteries that takes rotor position into account.

BRIEF DESCRIPTION

Aspects and advantages of the invention will be set forth in part in the following description, or may be obvious from the description, or may be learned through practice of the invention.

In one aspect, the present disclosure is directed to a method for testing capacity of at least one energy storage device of a pitch drive mechanism to drive a first rotor blade of a wind turbine connected to a power grid. The method includes defining a rotor position range for implementing a first test procedure for the energy storage device(s). Further, the method includes monitoring a rotor position of the first rotor blade. When the rotor position of the first rotor blade enters the rotor position range, the method includes initiating the first test procedure. The first test procedure includes pitching the first rotor blade via the energy storage device(s), measuring at least one operating condition of the energy storage device(s) during pitching, and determining a capacity of the energy storage device(s) to drive the first rotor blade based on the operating condition(s) thereof.

In one embodiment, the method also includes pitching the first rotor blade to a first pitch angle via the power grid before pitching the first rotor blade via the energy storage device(s). Thus, in another embodiment, the step of pitching the first rotor blade via the energy storage device(s) may include pitching the first rotor blade towards a different, second pitch angle via the energy storage device(s).

In further embodiments, the method may include determining a pitch speed of the first rotor blade during pitching of the first rotor blade towards the different, second pitch angle via the energy storage device(s) and determining the capacity of the energy storage device(s) to drive the first rotor blade based on the operating condition(s) of the energy storage device(s) and the pitch speed.

In several embodiments, the first pitch angle may include a power pitch angle, whereas the second pitch angle may include a feathered pitch angle. As such, the rotor position range may generally include rotor positions in which a motor torque of a pitch drive motor of the pitch drive mechanism acts against a predetermined threshold of gravity during pitching of the first rotor blade toward the feathered pitch angle.

More specifically, in certain embodiments, the step of defining the rotor position range may include selecting rotor positions that require an amount of energy equal to or above the predetermined threshold of gravity to pitch the first rotor blade towards the feathered pitch angle and excluding rotor positions that require an amount of energy below the predetermined threshold of gravity to pitch the first rotor blade towards the feathered pitch angle.

In additional embodiments, the operating condition(s) of the energy storage device(s) may include electrical conditions, such as battery voltage, capacitor voltage, or similar, as well as other conditions relating to various energy backup systems such as springs and/or hydraulic storages.

In several embodiments, after initiating the first test procedure, the method may include shifting the rotor position range by 120 degrees for a second rotor blade and initiating a second test procedure for the second rotor blade. In addition, after initiating the second test procedure, the method may include shifting the rotor position range by another 120 degrees for a third rotor blade and initiating a third test procedure for the third rotor blade.

In yet another embodiment, the method may include generating an alarm signal if the capacity of the energy storage device(s) to drive the first rotor blade is below a certain threshold.

In another aspect, the present disclosure is directed to a system for testing capacity of at least one energy storage device of a pitch drive mechanism to drive a first rotor blade of a wind turbine connected to a power grid. The system includes at least one sensor configured for monitoring a rotor position of the first rotor blade and a controller communicatively coupled to the sensor(s). The controller includes at least one processor configured to perform one or more operations, including but not limited to defining a rotor position range for implementing a first test procedure for the energy storage device(s), and, when the rotor position of the first rotor blade enters the rotor position range, initiating the first test procedure. The first test procedure includes pitching the first rotor blade to a first pitch angle via the power grid, pitching the first rotor blade towards a different, second pitch angle via the energy storage device(s), measuring at least one operating condition of the energy storage device(s) during pitching of the first rotor blade towards the different, second pitch angle via the energy storage device(s), and determining a capacity of the energy storage device(s) to drive the first rotor blade based on the operating condition(s) of the energy storage device(s). It should also be understood that the system may further include any of the additional features as described herein.

In yet another aspect, the present disclosure is directed to a method for testing capacity of at least one energy storage device of a pitch drive mechanism to drive a rotor blade of a wind turbine connected to a power grid. The method includes determining a rotor position of the rotor blade. The method also includes pitching the rotor blade towards a power position via the power grid. The method then includes pitching the rotor blade towards a feathered position via the energy storage device(s). Further, the method includes measuring at least one operating condition of the energy storage device(s) and a pitch speed of the rotor blade during pitching. In addition, the method includes determining a capacity of the energy storage device(s) to drive the rotor blade based on the rotor position and the operating condition(s) of the energy storage device(s) and/or the pitch speed. It should also be understood that the method may further include any of the additional features and/or steps as described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 1:
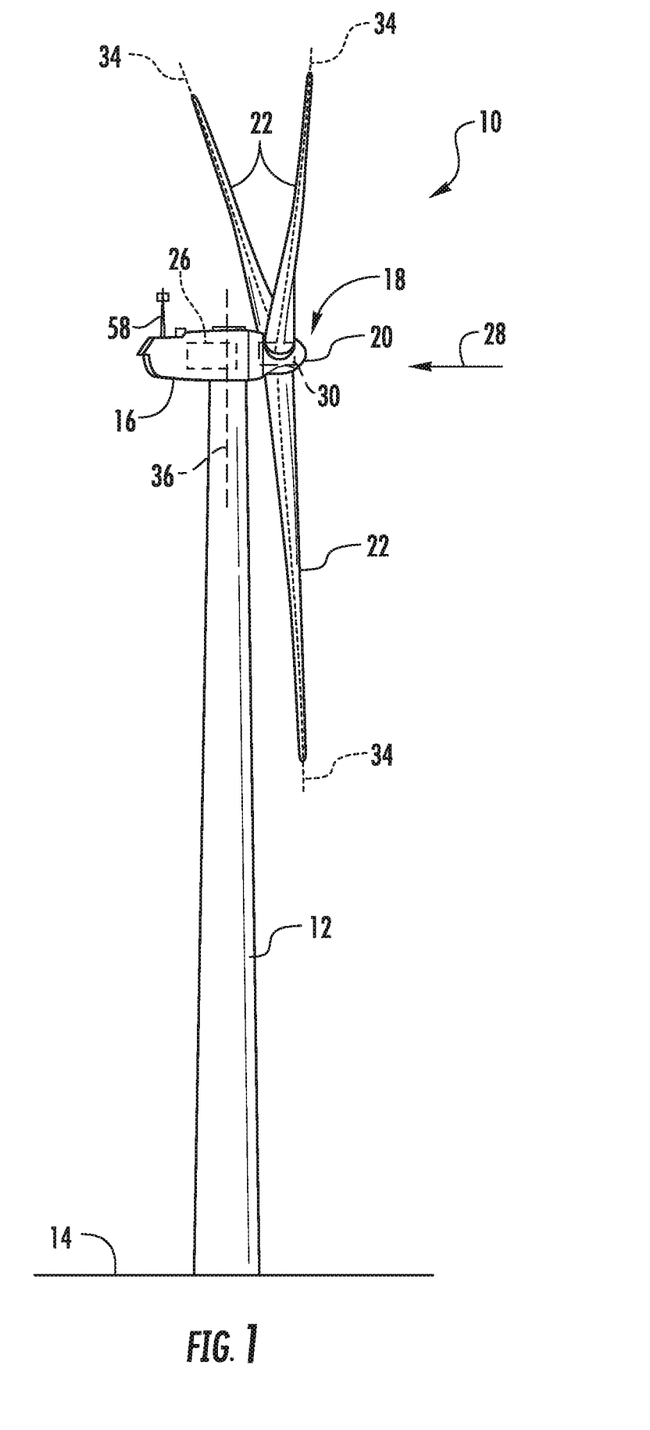
FIG. 1 illustrates a perspective view of one embodiment of a wind turbine according to the present disclosure.

Referring now to the drawings, FIG. 1 illustrates perspective view of one embodiment of a wind turbine 10 according to the present disclosure. As shown, the wind turbine 10 includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy, and subsequently, electrical energy. For instance, the hub 20 may be rotatably coupled to an electric generator 24 (FIG. 2) positioned within the nacelle 16 to permit electrical energy to be produced.

Figure 2:
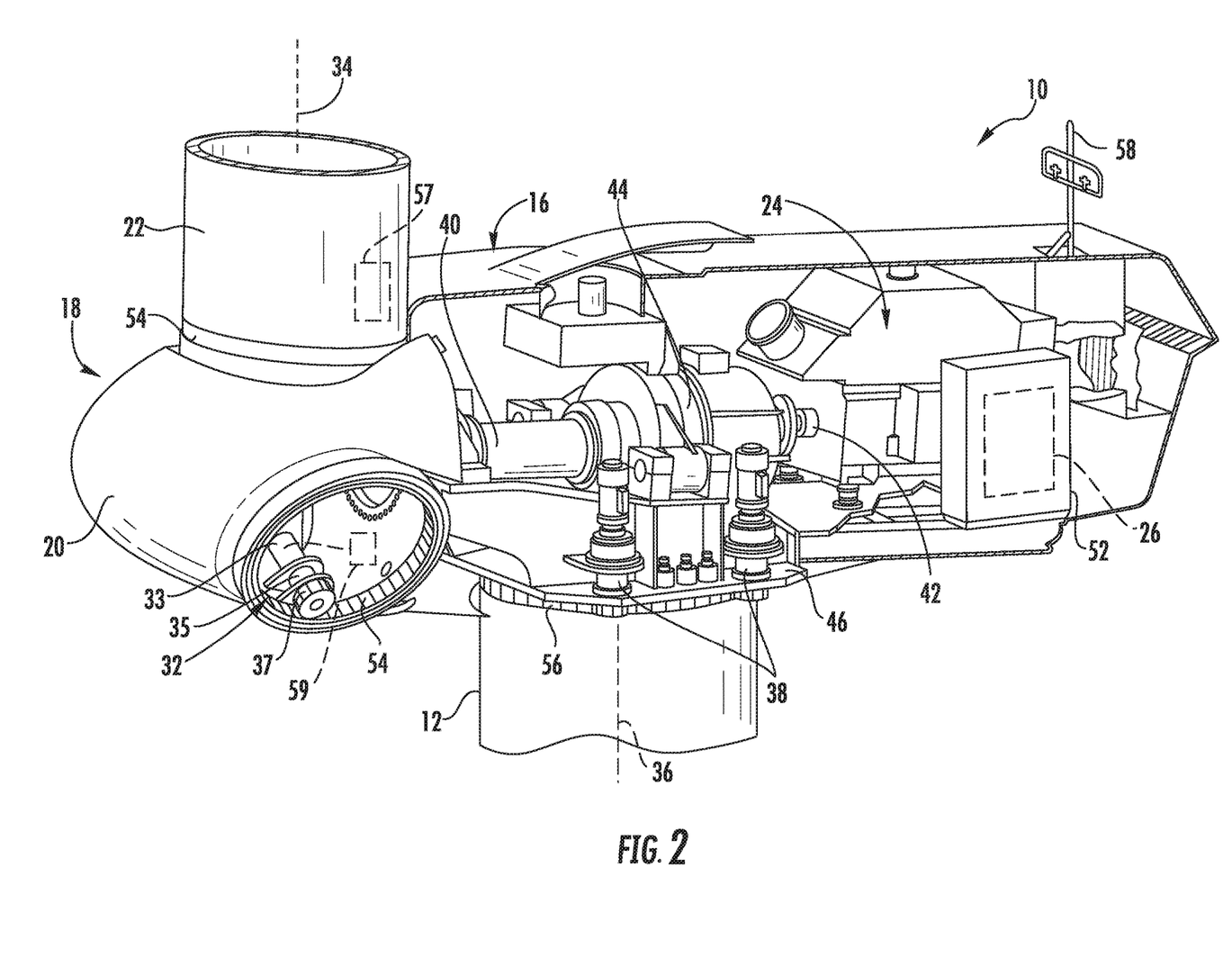
FIG. 2 illustrates a perspective, internal view of one embodiment of a nacelle of a wind turbine according to the present disclosure.

Referring now to FIG. 2, a simplified, internal view of one embodiment of the nacelle 16 of the wind turbine 10 is illustrated. As shown, a generator 24 may be disposed within the nacelle 16. In general, the generator 24 may be coupled to the rotor 18 of the wind turbine 10 for generating electrical power from the rotational energy generated by the rotor 18. For example, the rotor 18 may include a main shaft 40 coupled to the hub 20 for rotation therewith. The generator 24 may then be coupled to the main shaft 40 such that rotation of the main shaft 40 drives the generator 24. For instance, in the illustrated embodiment, the generator 24 includes a generator shaft 42 rotatably coupled to the main shaft 40 through a gearbox 44. However, in other embodiments, it should be appreciated that the generator shaft 42 may be rotatably coupled directly to the main shaft 40. Alternatively, the generator 24 may be directly rotatably coupled to the main shaft 40.

It should be appreciated that the main shaft 40 may generally be supported within the nacelle 16 by a support frame or bedplate 46 positioned atop the wind turbine tower 12. For example, the main shaft 40 may be supported by the bedplate 46 via a pair of pillow blocks mounted to the bedplate 46.

As shown in FIGS. 1 and 2, the wind turbine 10 may also include a turbine control system or a turbine controller 26 within the nacelle 16. For example, as shown in FIG. 2, the turbine controller 26 is disposed within a control cabinet 52 mounted to a portion of the nacelle 16. However, it should be appreciated that the turbine controller 26 may be disposed at any location on or in the wind turbine 10, at any location on the support surface 14 or generally at any other location. The turbine controller 26 may generally be configured to control the various operating modes (e.g., start-up or shutdown sequences) and/or components of the wind turbine 10.

Each rotor blade 22 may also include a pitch adjustment mechanism 32 configured to rotate each rotor blade 22 about its pitch axis 34. Further, each pitch adjustment mechanism 32 may include a pitch controller 30 (FIGS. 3 and 4), a pitch drive motor 33 (e.g., any suitable electric, hydraulic, or pneumatic motor), a pitch drive gearbox 35, and a pitch drive pinion 37. In such embodiments, the pitch drive motor 33 may be coupled to the pitch drive gearbox 35 so that the pitch drive motor 33 imparts mechanical force to the pitch drive gearbox 35. Similarly, the pitch drive gearbox 35 may be coupled to the pitch drive pinion 37 for rotation therewith. The pitch drive pinion 37 may, in turn, be in rotational engagement with a pitch bearing 54 coupled between the hub 20 and a corresponding rotor blade 22 such that rotation of the pitch drive pinion 37 causes rotation of the pitch bearing 54. Thus, in such embodiments, rotation of the pitch drive motor 33 drives the pitch drive gearbox 35 and the pitch drive pinion 37, thereby rotating the pitch bearing 54 and the rotor blade 22 about the pitch axis 34. Similarly, the wind turbine 10 may include one or more yaw drive mechanisms 38 communicatively coupled to the controller 26, with each yaw drive mechanism(s) 38 being configured to change the angle of the nacelle 16 about a yaw axis 36 relative to the wind (e.g., by engaging a yaw bearing 56 of the wind turbine 10).

Further, the turbine controller 26 may also be communicatively coupled to each pitch adjustment mechanism 32 of the wind turbine 10 (one of which is shown) through a separate or integral pitch controller 30 (FIG. 1) for controlling and/or altering the pitch angle of the rotor blades 22 (i.e., an angle that determines a perspective of the rotor blades 22 with respect to the direction 28 of the wind).

In addition, as shown in FIG. 2, one or more sensors 57, 58, 59 may be provided on the wind turbine 10. More specifically, as shown, a blade sensor 57 may be configured with one or more of the rotor blades 22 to monitor the rotor blades 22. Further, as shown, a wind sensor 58 may be provided on the wind turbine 10. For example, the wind sensor 58 may a wind vane, and anemometer, a LIDAR sensor, or another suitable sensor that measures wind speed and/or direction. In addition, a pitch sensor 59 may be configured with each of the pitch drive mechanism 32, e.g. with one or more batteries of the pitch drive motors 33 thereof, which will be discussed in more detail below. As such, the sensors 57, 58, 59 may further be in communication with the controller 26, and may provide related information to the controller 26. For example, the pitch sensor(s) 59 may correspond to temperature sensors that send temperature signals to the controllers 26, 30 to indicate an actual temperature of the pitch batteries, which is described in more detail herein.

It should also be appreciated that, as used herein, the term "monitor" and variations thereof indicates that the various sensors of the wind turbine 10 may be configured to provide a direct measurement of the parameters being monitored and/or an indirect measurement of such parameters. Thus, the sensors described herein may, for example, be used to generate signals relating to the parameter being monitored, which can then be utilized by the controller 26 to determine the condition.

Figure 3:
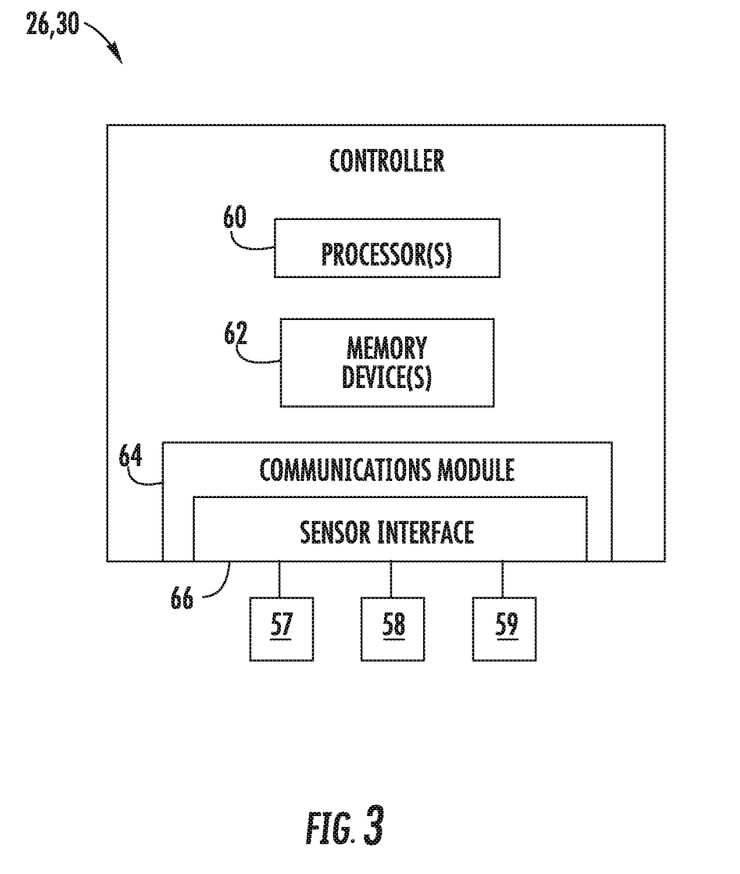
FIG. 3 illustrates a schematic diagram of one embodiment of suitable components that may be included in a wind turbine controller according to the present disclosure.

Referring now to FIG. 3, there is illustrated a block diagram of one embodiment of suitable components that may be included within the controllers 26, 30 according to the present disclosure. As shown, the controllers 26, 30 of the present disclosure may include one or more processor(s) 60 and associated memory device(s) 62 configured to perform a variety of computer-implemented functions (e.g., performing the methods, steps, calculations and the like and storing relevant data as disclosed herein). Additionally, the controllers 26, 30 may also include a communications module 64 to facilitate communications between the controllers 26, 30 and the various components of the wind turbine 10. Further, the communications module 64 may include a sensor interface 66 (e.g., one or more analog-to-digital converters) to permit signals transmitted from one or more sensors 57, 58, 59 to be converted into signals that can be understood and processed by the processors 60. It should be appreciated that the sensors 57, 58, 59 may be communicatively coupled to the communications module 64 using any suitable means. For example, as shown in FIG. 3, the sensors 57, 58, 59 are coupled to the sensor interface 66 via a wired connection. However, in other embodiments, the sensors 57, 58, 59 may be coupled to the sensor interface 66 via a wireless connection, such as by using any suitable wireless communications protocol known in the art.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 62 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 62 may generally be configured to store suitable computer-readable instructions that, when implemented by the processor(s) 60, configure the controller 26 to perform various functions including, but not limited to, transmitting suitable control signals to implement corrective action(s) in response to a distance signal exceeding a predetermined threshold as described herein, as well as various other suitable computer-implemented functions.

Figure 4:
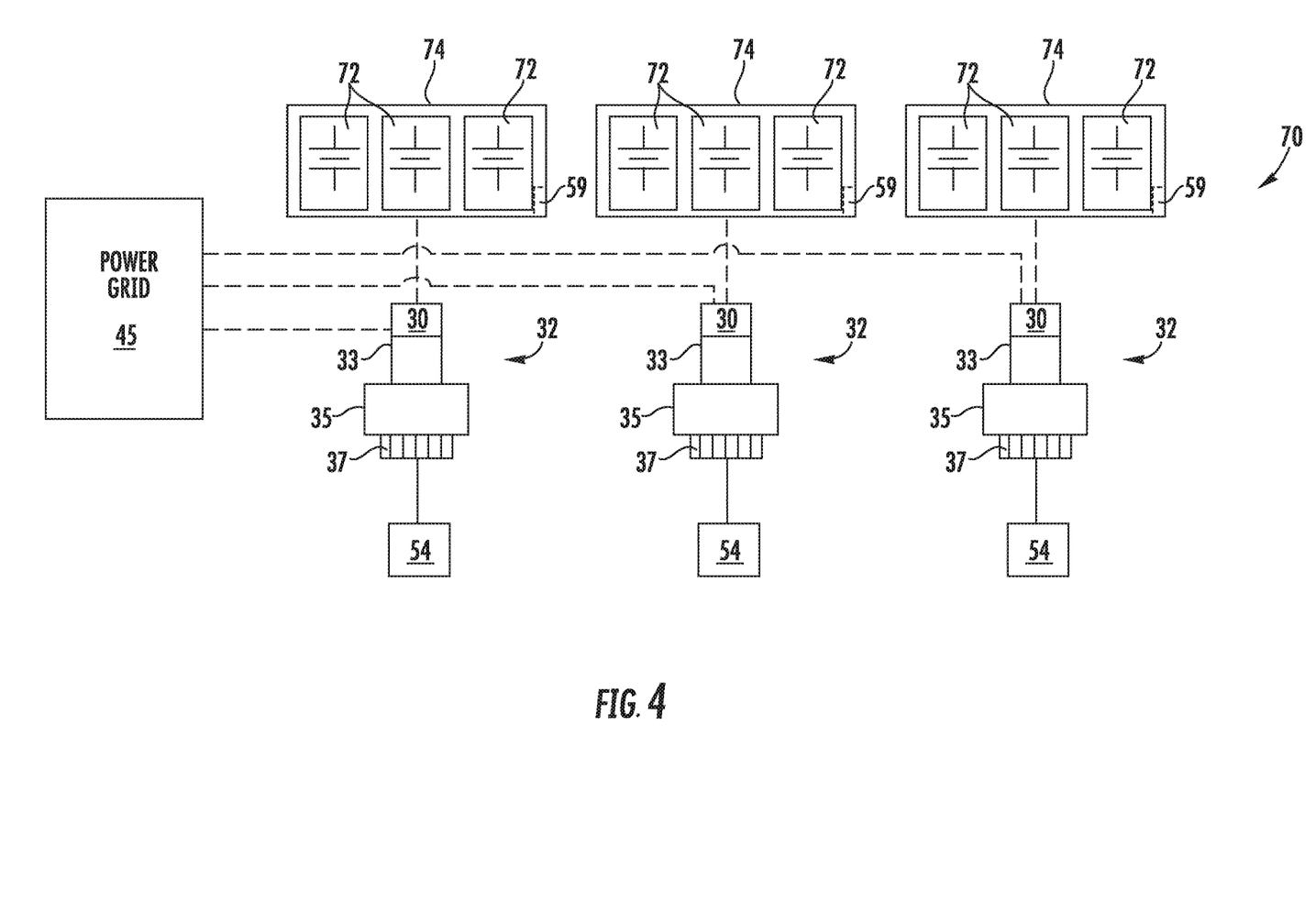
FIG. 4 illustrates a schematic diagram of one embodiment of a pitch system of a wind turbine according to the present disclosure.

Referring now to FIG. 4, a schematic diagram of one embodiment an overall pitch system 70 for the wind turbine 10 is illustrated. More specifically, as shown, the pitch system 70 may include a plurality of pitch drive mechanisms 32, i.e. one for each pitch axis 34, that are controlled via one or more pitch controllers 30. Further, as shown, each of the pitch controllers 30 may be communicatively coupled to the power grid 45 as well as one or more backup energy storage devices or batteries 72. More specifically, as shown, each pitch drive mechanism 32 may be associated with a plurality of backup batteries 72 that are stored in a battery cabinet 74.

During normal operation of the wind turbine 10, the pitch drive motors 33 are driven by the power grid 45. However, in some instances, such as during an adverse grid event or grid loss, the pitch drive motors 33 may be driven by one or more backup batteries 72. If pitching of the rotor blades 22 relies on such batteries 72 (i.e. due to a grid loss), it is important to ensure that the batteries 72 are capable of operating when needed. Thus, the turbine controller 26 (or pitch controller 30) is configured to perform a test procedure for testing one or more of the batteries 72 on a regular basis to ensure the batteries 72 are operating properly.

Figure 5:
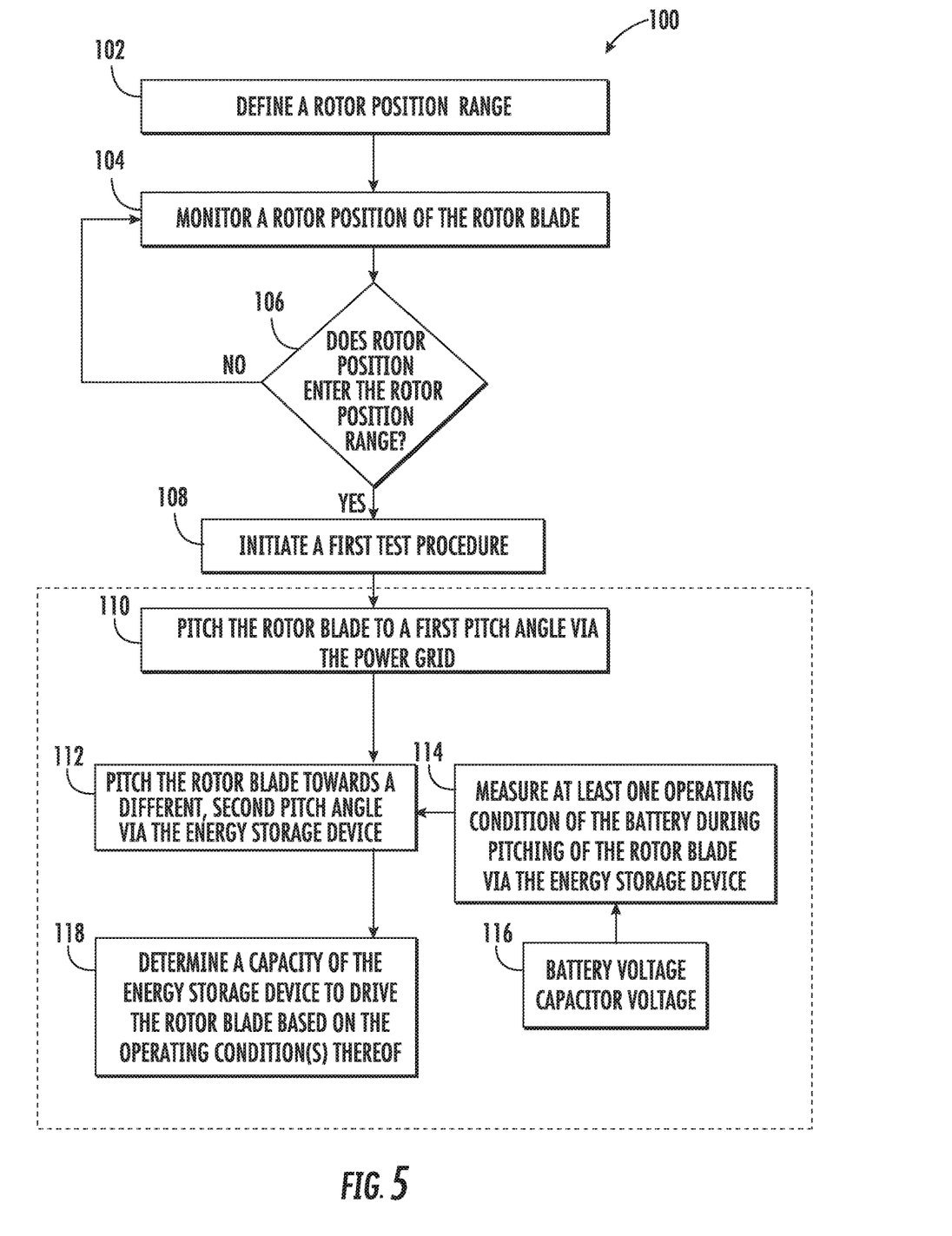
FIG. 5 illustrates a flow diagram of one embodiment of a method for testing capacity of a battery of a pitch drive mechanism to drive a rotor blade of a wind turbine connected to a power grid according to the present disclosure.

More specifically, as shown in FIG. 5, a flow diagram of one embodiment of a method 100 for testing capacity of at least one energy storage device 72 of one or more of the pitch drive mechanisms 32 to drive one of the rotor blades 16 is illustrated. As shown at 102, the method 100 includes defining a rotor position range for implementing a first test procedure for the energy storage device 72. As shown at 104, the method 100 includes monitoring a rotor position of the rotor blade 16. When the rotor position of the rotor blade enters the rotor position range, as shown at 106, the method 100 includes initiating a first test procedure 108. For example, as shown at 110, the first test procedure includes pitching the rotor blade 16 to a first pitch angle via the power grid 45. As shown at 112, the test procedure 108 also includes pitching the rotor blade 16 towards a different, second pitch angle via the energy storage device 72. In one embodiment, the first pitch angle may include a power pitch angle (i.e. closer to 0 degrees), whereas the second pitch angle may include a feathered pitch angle (i.e. closer to 90 degrees). As shown at 114, the test procedure 108 further includes measuring at least one operating condition of the energy storage device 72 during pitching of the rotor blade 16 via the energy storage device 72. For example, as shown at 116, the operating condition(s) of the energy storage device(s) 72 may include electrical conditions, such as battery voltage, capacitor voltage, or similar, as well as other conditions relating to various energy backup systems such as springs and/or hydraulic storages. As shown at 118, the test procedure 108 includes determining a capacity of the energy storage device 72 to drive the rotor blade 16 based on the operating condition(s) thereof.

In further embodiments, the method 100 may also include determining a pitch speed of the rotor blade 16 during pitching of the rotor blade 16 towards the feathered pitch angle via the energy storage device 72 and determining the capacity of the energy storage device 72 to drive the rotor blade 16 based on the operating condition(s) of the energy storage device 72 and the pitch speed.

The rotor position range may generally include rotor positions in which a motor torque of the pitch drive motor 33 acts against a predetermined threshold of gravity during pitching of the rotor blade 16 toward the feathered pitch angle. As such, the rotor position range may be defined by selecting rotor positions that require an amount of energy equal to or above the predetermined threshold of gravity to pitch the rotor blade 16 towards the feathered pitch angle and excluding rotor positions that require an amount of energy below the predetermined threshold of gravity to pitch the rotor blade 16 towards the feathered pitch angle.

In several embodiments, after initiating/performing the first test procedure 108, the method 100 may include shifting the rotor position range by 120 degrees for a second rotor blade and initiating a second test procedure for the second rotor blade. In addition, after initiating/performing the second test procedure, the method 100 may include shifting the rotor position range by another 120 degrees for a third rotor blade and initiating a third test procedure for the third rotor blade. Thus, each test is implemented for a single blade at a time and can be implemented any suitable number of times to test any number of rotor blades, including more and less than three. The blades not being tested can be used to control the rotor 18 to a given (i.e. slow) rotational speed.

In yet another embodiment, the method 100 may include generating an alarm signal if the capacity of the energy storage device 72 to drive the rotor blade 16 for any of the test procedures is below a certain threshold. As such, personnel can schedule preventative maintenance to replace the defective energy storage device(s) 72 before a failure occurs.

Figure 6:
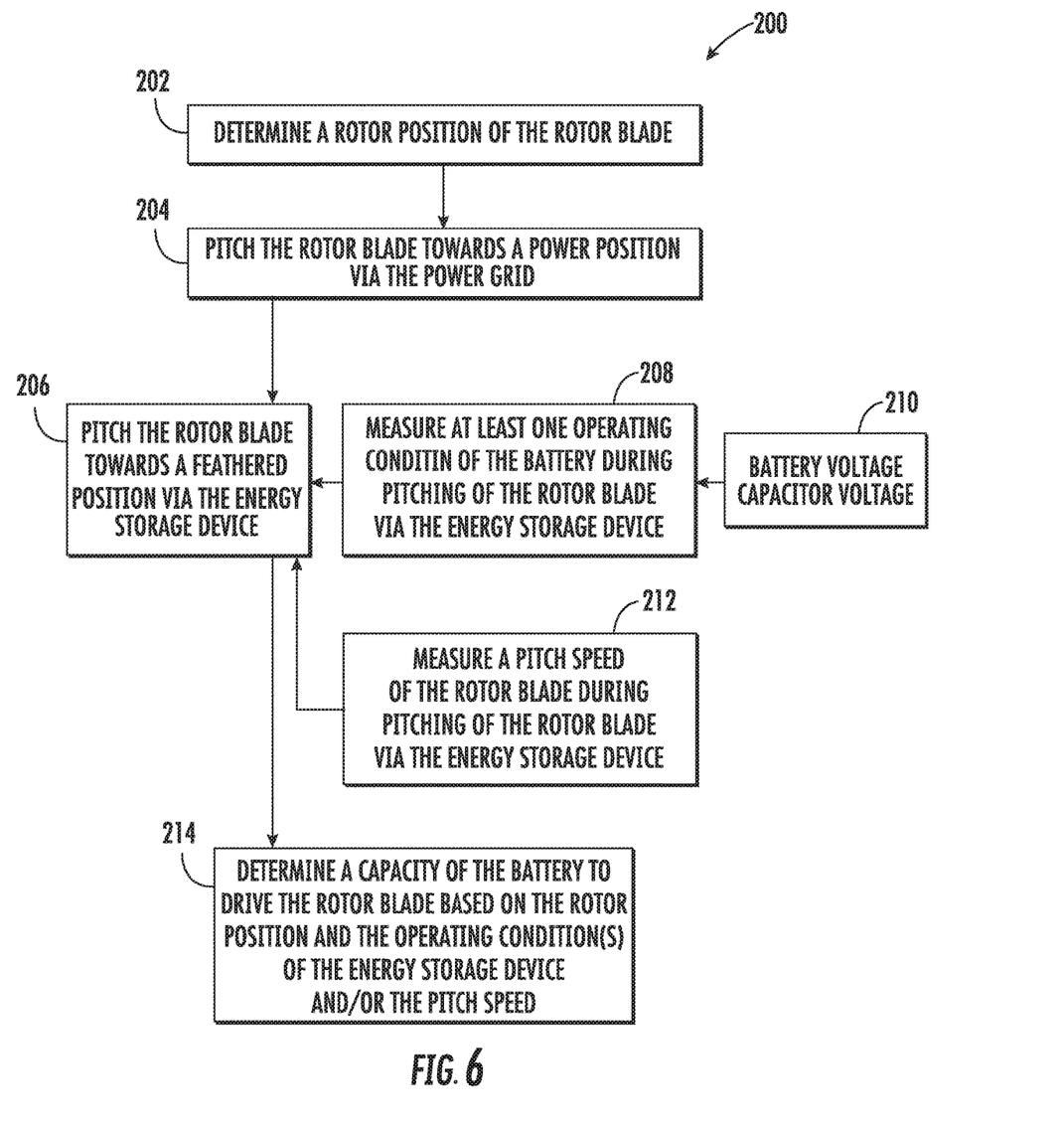
FIG. 6 illustrates a flow diagram of another embodiment of a method for testing capacity of a battery of a pitch drive mechanism to drive a rotor blade of a wind turbine connected to a power grid according to the present disclosure.

Referring now to FIG. 6, a flow diagram of another embodiment of a method 200 for testing capacity of one or more of the batteries 72 of the pitch drive mechanisms 32 to drive one of the rotor blades 16, e.g. in the event of a grid failure, is illustrated. As shown at 202, the method 200 includes determining a rotor position of the rotor blade 16. As shown at 204, the method 200 includes pitching the rotor blade 16 towards a power position via the power grid 45. As shown at 206, the method 200 includes pitching the rotor blade 16 towards a feathered position via the energy storage device 72. During pitching of the rotor blade 16 towards a feathered position via the energy storage device 72, as shown at 208, the method 200 includes measuring at least one operating condition of the energy storage device 72. In addition, as shown at 212, the method 200 may also include determining a pitch speed of the rotor blade 16 during pitching of the rotor blade 16 towards a feathered position via the energy storage device 72. As shown at 214, the method 200 includes determining a capacity of the energy storage device 72 to drive the rotor blade 16 based on the rotor position and the operating condition(s) of the energy storage device 72 and/or the pitch speed.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for testing capacity of at least one energy storage device of a pitch drive mechanism to drive a first rotor blade of a wind turbine, the wind turbine connected to a power grid, the method comprising:

defining a rotor position range for implementing a first test procedure for the at least one energy storage device, the rotor position range including rotor positions in which a motor torque of a pitch drive motor of the pitch drive mechanism acts against a predetermined threshold of gravity during pitching of the first rotor blade toward a feathered pitch angle;

monitoring a rotor position of the first rotor blade;

when the rotor position of the first rotor blade enters the rotor position range, initiating the first test procedure, the first test procedure comprising:

pitching the first rotor blade toward the feathered pitch angle via the at least one energy storage device;

measuring at least one operating condition of the at least one energy storage device during pitching; and, determining a capacity of the at least one energy storage device to drive the first rotor blade based on the at least one operating condition of the at least one energy storage device.

2. The method of claim 1, further comprising pitching the first rotor blade to a first pitch angle via the power grid before pitching the first rotor blade via the at least one energy storage device.

3. The method of claim 2, wherein pitching the first rotor blade via the at least one energy storage device further comprises pitching the first rotor blade towards a different, second pitch angle via the at least one energy storage device.

4. The method of claim 3, further comprising determining a pitch speed of the first rotor blade during pitching of the first rotor blade towards the different, second pitch angle via the at least one energy storage device and determining the capacity of the at least one energy storage device to drive the first rotor blade based on the at least one operating condition of the at least one energy storage device and the pitch speed.

5. The method of claim 3, wherein the first pitch angle comprises a power pitch angle and the second pitch angle.

6. The method of claim 1, wherein defining the rotor position range further comprises selecting rotor positions that require an amount of energy equal to or above the predetermined threshold of gravity to pitch the first rotor blade towards the feathered pitch angle and excluding rotor positions that require an amount of energy below the predetermined threshold of gravity to pitch the first rotor blade towards the feathered pitch angle.

7. The method of claim 1, wherein the at least one operating condition of the at least one energy storage device comprises at least one of a battery voltage or a capacitor voltage.

8. The method of claim 1, further comprising, after initiating the first test procedure, shifting the rotor position range by 120 degrees for a second rotor blade and initiating a second test procedure for the second rotor blade.

9. The method of claim 8, further comprising, after initiating the second test procedure, shifting the rotor position range by another 120 degrees for a third rotor blade and initiating a third test procedure for the third rotor blade.

10. The method of claim 1, further comprising generating an alarm signal if the capacity of the at least one energy storage device to drive the first rotor blade is below a certain threshold.

11. A system for testing capacity of at least one energy storage device of a pitch drive mechanism to drive a first rotor blade of a wind turbine, the wind turbine connected to a power grid, the system comprising:

at least one sensor configured for monitoring a rotor position of the first rotor blade;

a controller communicatively coupled to the at least one sensor, the controller comprising at least one processor configured to perform one or more operations, the one or more operations comprising:

defining a rotor position range for implementing a first test procedure for the at least one energy storage device, the rotor position range including rotor positions in which a motor torque of a pitch drive motor of the pitch drive mechanism acts against a predetermined threshold of gravity during pitching of the first rotor blade toward a feathered pitch angle;

when the rotor position of the first rotor blade enters the rotor position range, initiating the first test procedure, the first test procedure comprising:

pitching the first rotor blade to a first pitch angle via the power grid;

pitching the first rotor blade from the first pitch angle toward the feathered pitch angle via the at least one energy storage device;

measuring at least one operating condition of the at least one energy storage device during pitching of the first rotor blade toward the feathered pitch angle via the at least one energy storage device; and, determining a capacity of the at least one energy storage device to drive the first rotor blade based on the at least one operating condition of the at least one energy storage device.

12. The system of claim 11, wherein the one or more operations further comprise determining a pitch speed of the first rotor blade during pitching of the first rotor blade toward the feathered pitch angle via the at least one energy storage device and determining the capacity of the at least one energy storage device to drive the first rotor blade based on the at least one operating condition of the at least one energy storage device and the pitch speed.

13. The system of claim 11, wherein the first pitch angle comprises a power pitch angle.

14. The system of claim 11, wherein defining the rotor position range further comprises selecting rotor positions that require an amount of energy equal to or above the predetermined threshold of gravity to pitch the first rotor blade towards the feathered pitch angle and excluding rotor positions that require an amount of energy below the predetermined threshold of gravity to pitch the first rotor blade towards the feathered pitch angle.

15. The system of claim 11, wherein the at least one operating condition of the at least one energy storage device comprises at least one of a battery voltage or a capacitor voltage.

16. A method for testing capacity of a battery of a pitch drive mechanism to drive a rotor blade of a wind turbine, the wind turbine connected to a power grid, the method comprising:

determining a rotor position of the rotor blade;

pitching the rotor blade towards a power position via the power grid;

defining a rotor position range for implementing a first test procedure for the battery, the rotor position range including rotor positions in which a motor torque of a pitch drive motor of the pitch drive mechanism acts against a predetermined threshold of gravity during pitching of the first rotor blade toward a feathered pitch angle;

monitoring a rotor position of the first rotor blade;

when the rotor position of the first rotor blade enters the rotor position range, pitching the rotor blade towards a feathered position via the battery;

measuring a battery voltage of the battery and a pitch speed of the rotor blade during pitching; and determining a capacity of the battery at least one energy storage device to drive the rotor blade based on the rotor position and the battery voltage or the pitch speed.

17. The method of claim 16, wherein defining the rotor position range for the rotor blade further comprises selecting rotor positions that require an amount of energy equal to or above the predetermined threshold of gravity to pitch the rotor blade towards the feathered position and excluding rotor positions that require an amount of energy below the predetermined threshold of gravity to pitch the rotor blade towards the feathered position.

\* \* \* \* \*